United States Patent [19]

Deutsch et al.

[11] Patent Number: 4,933,635

[45] Date of Patent: Jun. 12, 1990

[54] IN-LINE PROCESS MONITORS FOR THIN FILM WIRING

[75] Inventors: Alina Deutsch, Mount Kisco; Modest M. Oprysko, Mahopac; John J. Ritsko, Mount Kisco, all of N.Y.; Laura B. Rothman, South Kent, Conn.; Helen L. Yeh, Katonah; Atilio Zupicich, Astoria, both of N.Y.

[73] Assignee: International Business Machines Corporation, Armonk, N.Y.

[21] Appl. No.: 288,390

[22] Filed: Dec. 22, 1988

[51] Int. Cl.⁵ .................................... G01R 27/02
[52] U.S. Cl. ............................ 324/158 R; 324/73.1; 324/158 D
[58] Field of Search .......... 324/158 D, 158 R, 73 PC, 324/65 R, 537; 350/397; 364/474.08, 559; 219/121.63, 121.66

[56] References Cited

U.S. PATENT DOCUMENTS

| | | | |
|---|---|---|---|
| 3,388,457 | 6/1968 | Totta | 324/158 D |
| 3,668,523 | 6/1972 | Kuhn | 324/158 D |
| 3,992,663 | 11/1976 | Seddick | 324/52 |
| 4,144,493 | 3/1979 | Lee et al. | 324/158R |
| 4,719,411 | 1/1988 | Beuhler | 324/73R |
| 4,725,773 | 2/1988 | Lieneweg | 324/65R |
| 4,727,319 | 2/1988 | Shahriary | 324/158P |

Primary Examiner—Reinhard J. Eisenzopf
Assistant Examiner—Edward Urban
Attorney, Agent, or Firm—Perman & Green

[57] ABSTRACT

A thin film region 14 of a multichip carrier 10 is provided with at least one fabrication process or tooling monitor for monitoring the quality of the fabrication process during the sequential formation of the layers of the region 14. The process monitor is formed with a desired layer or layers of the thin film region, such as by a photolithographic process. A centrally disposed active wiring region 30 of a layer is surrounded by peripherally disposed fabrication monitor sites 32. The sites 32 can be located such that they do not occupy or interfere with the surface area required for the wiring region 30 while still being disposed near enough to the wiring region such that the electrical and physical characteristics of the thin film is substantially the same. Four different types of thin film fabrication process monitors are disclosed, including a line/via monitor, a dielectric monitor, a laser assisted repair monitor and a laser assisted engineering change monitor.

25 Claims, 5 Drawing Sheets

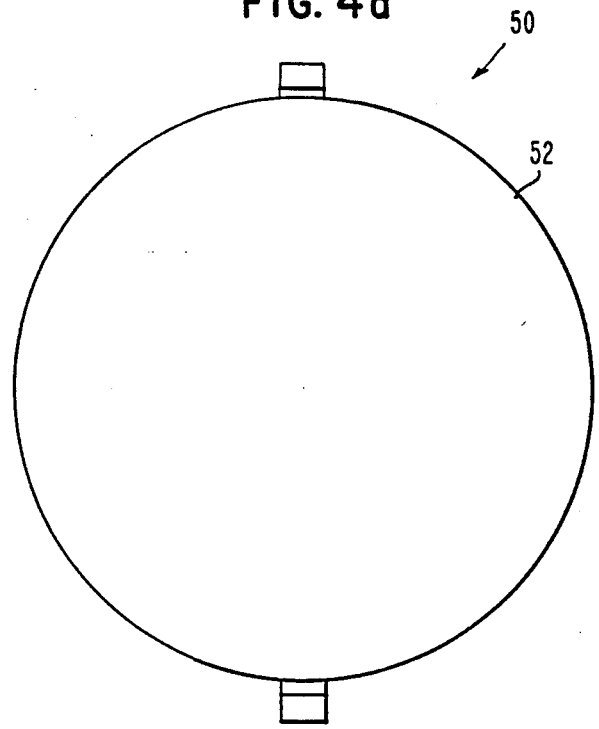
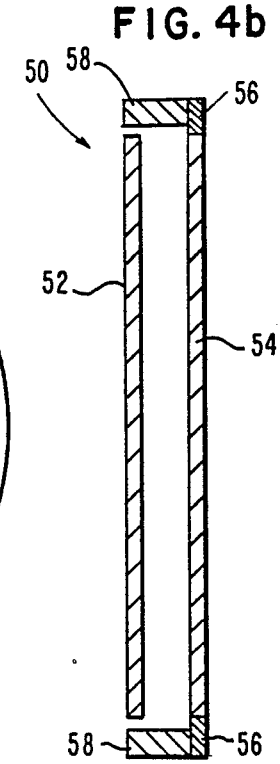

IN-LINE PROCESS MONITORS FOR THIN FILM WIRING

FIELD OF THE INVENTION

This invention relates generally to thin film devices and to methods of fabricating same and, in particular, to a thin film device having at least one process or tooling monitor fabricated integrally therewith and to methods of testing a thin film device which employs at least one process or tooling monitor which is integrally formed with the thin film device.

BACKGROUND OF THE INVENTION

In a thin film device, such as a multichip carrier having a substrate over which a plurality of thin film wiring layers are sequentially formed, inspection of each thin film layer as it is fabricated is often not economically viable due at least to the large number of fine geometry wiring paths which are distributed over the relatively much large surface area of each of the thin film layers. Thus, the conventional practice is to test the full stack of thin film wiring for functionality only from a top surface. If a defect is detected, the repair can be accomplished by using either wire bonded discrete wires or laser assisted techniques, the repair typically being limited to surface areas which are accessible between the integrated circuit chips which are bonded to the top surface. One significant disadvantage of both of these repair methods is that they require the dedication of significant areas of the surface. Also, significant portions of the internal wiring may be inaccessible from the top surface, these portions being essentially unrepairable. In that the costs associated with the fabrication of the carrier have already been substantially incurred by the time the final testing cycle is initiated, it can be realized that discarding an unrepairable complex carrier is not economically advantageous.

Process monitors are known in integrated circuit wafer manufacturing; however these monitors are generally not suitable for use with multichip carriers manufacturing methodologies for a number of reasons.

For example, in the case of semiconductor wafer fabrication the process monitors measure active device characteristics such as $V_{BE}$, $\beta$, $r_b$, etc. while in a thin film layer region the critical parameters relate to the integrity of the connectivity between layers. Also, certain thin film electrical characteristics, such as dielectric constant, metal resistivity and via contact resistance, affect the thin film region performance. For example, the dielectric constant affects the transmission line impedance, propagation delay and coupled noise. The dielectric constant also yields information relating to moisture or solvent trapping, improper curing cycles, etc.

Another distinction between semiconductor wafer fabrication monitors and those required for thin film wiring fabrication is that for the wafer, for each fabrication step, active device and even personalization wiring require unique and substantially unrelated processing techniques. In the case of a multichip carrier to which this invention is especially applicable the thin film wiring is fabricated by repeating substantially the same process steps for each layer in the sequentially, built thin film region with the same metallurgy and ground rules. Also, in the case of thin film wiring fabrication, if a problem could be detected by a process monitor in one of the initial layers, such as too high a resistivity for a bottom power plane, the subsequent processing step conditions or tooling could be altered to compensate for the problem in order to build the subsequent layers properly.

In the case of thin film devices it is desirable to detect catastrophic processing failures such that the build of the full stack of thin film layers can be halted. In the non-analogous case of semiconductor wafer fabrication a monitor which indicates a catastrophic process failure also generally indicates that the wafer is unusable. However, in a hybrid module having thin film layers, the defective thin film layers can be lapped off the top of the underlying substrate and thin film processing can restart on the polished substrate surface.

Another distinction is that tool set-up monitors are not used in conventional chip fabrication because in-situ repair or engineering changes (EC) are not practiced on wafers. Malfunctioning chips are usually discarded. However, costly multichip carriers that may require months to be completed cannot be as readily discarded. The facilitation of repair/EC techniques is thus essential. As such, it would be desirable that tool monitors allow the set-up of parameters for laser tooling in order to prevent damage to the active area of the module and to obtain the best conditions for optimum electrical performance. One advantageous position for such tooling set-up would be at sites which do not interfere in any way with the densely wired thin film active wiring region, such as sites disposed peripheral to the active thin film wiring areas. These sites preferably also providing sites for wire bonding and decal ultrasonic bonding EC activities.

Although thin film sequential processing is practiced presently for fabricating personalization layers for logic or array chips on silicon wafers this application is not analogous to that of thin film multichip carriers in that dedicated chip sites are available for placement of process and/or tooling monitors, these medicated chip sites being denoted to process/yield monitoring. Also, each such dedicated chip site on the wafer correspondingly reduces the number of useable devices which can be fabricated on the wafer with a consequent reduction in overall wafer yield.

In the case of the multichip carrier the entire active thin film wiring area is occupied by dense inter-chip wiring and contains no chip sites which can be dedicated to providing such process/tooling monitor sites.

Based on the foregoing it can be realized that in order to fabricate multichip carriers having thin film layers of significant wiring density, in a reliable and cost effective manner, that appropriate fabrication process monitors are an essential requirement. However, this need has remained unfulfilled until the invention of the thin film process monitors which are described in detail below.

SUMMARY OF THE INVENTION

The foregoing and other problems are overcome by a thin film device constructed in accordance with the invention wherein the device includes at least one layer of thin film material having an active wiring area containing electrical conductors and an electrical insulator, the layer further having at least one thin film fabrication process or tooling monitor integrally formed therewith at a position or positions which do not reduce the area of or substantially interfere with the active wiring area.

The invention also provides a method of fabricating a device having at least one thin film layer. The method includes the steps of forming the thin film layer such that the layer includes an active wiring area containing a plurality of electrically conductive pathways and an electrical insulator; providing, during the step of forming, at least one thin film fabrication process or tooling monitor upon the layer at a position which does not reduce the area of or substantially interfere with the active wiring area and detecting, by way of the monitor, at least one characteristic of the thin film layer.

The invention further provides a method of calibrating a laser tool for operation on a thin film layer. This method includes the steps of providing a thin film layer including a plurality of electrically conductive pathways and an electrical insulator; the layer also being provided with a laser tool calibration region having two or more electrically conductive regions which are spaced apart one from another. Further steps include operating the laser tool within the laser tool calibration region to form a test conductor such that the two conductive regions are conductively coupled together; visually determining a structural characteristic of or measuring an electrical characteristic of the test conductor and adjusting, if necessary, one or more operational parameters of the laser tool based upon the value of the measured electrical characteristic or visual observation.

The invention provides for the addition of in-line process and tooling monitors sites outside of the active thin film wiring area of a multi-chip carrier which allows processing integrity to be monitored at each level of a sequentially built thin film structure without the need of costly large area, high resolution optical inspection tools.

The invention further provides for in-line process testing of an active thin film region by peripherally made measurements which do not damage or contaminate the active region. Early malfunction in processing is readily detected allowing the lengthy fabrication cycle to be interrupted. A high quality, high yield final product results, the final product having significantly less surface area denoted for repair functions such as buried EC lines or pads. In addition, final testing of the module from the top surface is made less extensive and costly. The process monitors are realizable in a relatively very small surface area facilitating their disposition around the periphery of the active area and even within the active area at locations of lesser wiring density.

The invention also provides for laser-assisted process monitors such that laser processes can be used with a high degree of confidence, thereby reducing or eliminating post-processing reliability tests. Furthermore, by the use of in-situ probes the laser processes are initially fine-tuned to the physical characteristics of a particular thin film region thereby optimizing the electrical characteristics of the resultant conductors.

BRIEF DESCRIPTION OF THE DRAWING

The above set forth and other features of the invention will be made more apparent in the ensuing Detailed Description of the Invention when read in conjunction with the attached Drawing, wherein:

FIG. 4a shows a top view and FIG. 4b a cross-sectional view of a dielectric measurement monitor site 50 which includes two circular metallic plates 52 and 54;

DETAILED DESCRIPTION OF THE INVENTION

Figure 1:
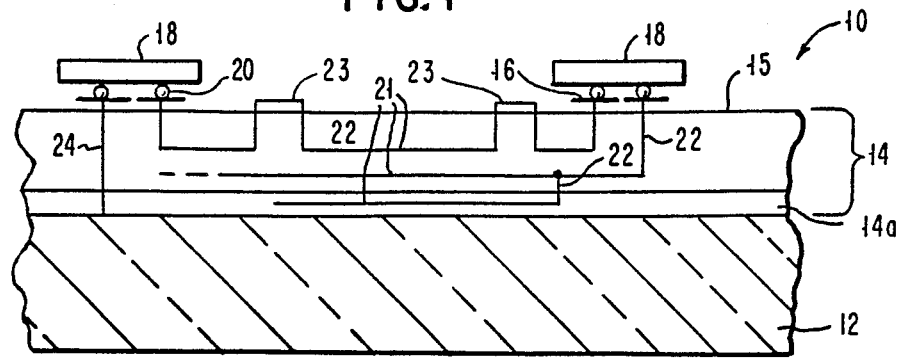
FIG. 1 is a partial cross-sectional view, not to scale, of a multichip carrier 10 showing a thin film region 14 disposed on a substrate 12.

FIG. 1 shows in partial cross-section, not to scale, a multichip carrier 10. The carrier includes a supporting substrate 12 which can further be used for power distribution and/or for providing further interconnections.

Present typical interconnecting carriers are fabricated by laminating layers that are processed in parallel, and individually inspected. The minimum size of features which may be optically inspected on such layers is approximately 100 micrometers, while the corresponding wiring capacity of each of the layers is approximately 10 meters.

In the embodiment of FIG. 1, overlying substrate 12 is a thin film wiring region 14 which, for modern and projected devices, may include up to a dozen sequentially built individual thin film layers. The layers are typically organized such that a first layer contains electrical conductors running in one given direction while a second layer contains wires running in a direction perpendicular to the conductors of the first layer. The conductors of the two layers are interconnected by an intervening via layer having conductors extending vertically through the layer. Disposed on one or both sides of the x-y plane pair is a reference plane or layer having, for example, a grid of conductors disposed thereon. The stack of x-y wiring layers with their respective reference planes is referred to as an x-y plane-pair. The region 14 may contain one or more of such x-y plane pairs which are interconnected by further via layers. The conductors within the various layers may be formed by a number of suitable thin film fabrication techniques such as, for example, a photolithographic technique.

One of these layers is designated as 14a in FIG. 1. These layers are processed sequentially by known thin film fabrication techniques upon the substrate 12 and typically include an insulator material and metal wiring conductors. By example, the minimum dimensions of features within the thin film region 14 is approximately 10-30 micrometers while the overall linear surface dimension of one of the thin film layers may be over 100 mm. Due to the small dimensions of the individual wiring conductors the wiring capacity of one of the layers may be hundreds of meters and include as many as $10^7$ wiring positions.

The top surface 15 of the carrier 10 is provided with bonding pads 16 for bonding to corresponding pads on a surface of a semiconductor chip 18. Solder droplets 20, wire bonds, or TAB (tape-automated-bonding) may be employed to electrically and physically couple the chip 18 to the pads 16. Typically, the carrier 10 includes a large number of chips 18 which are interconnected one to another through wiring paths 21 and vias 22 formed within the thin film region 14. Certain of the internally disposed wiring paths are typically brought to the top surface 15 to provide access pads 23 which can be employed to facilitate the accomplishment of engineering changes and/or testing of the completed carrier 10. Connection of the chips 18 to circuitry and power buses external to the carrier 10 is made by vias 24 which extend through the thin film region 14. Bottom or edge connections couple the carrier to other circuitry. Typically a large number of such carriers 10, each having a number of chips 18, are interconnected one to another by an underlying larger carrier to form a portion of, for example, a high speed digital computer.

Figure 2:
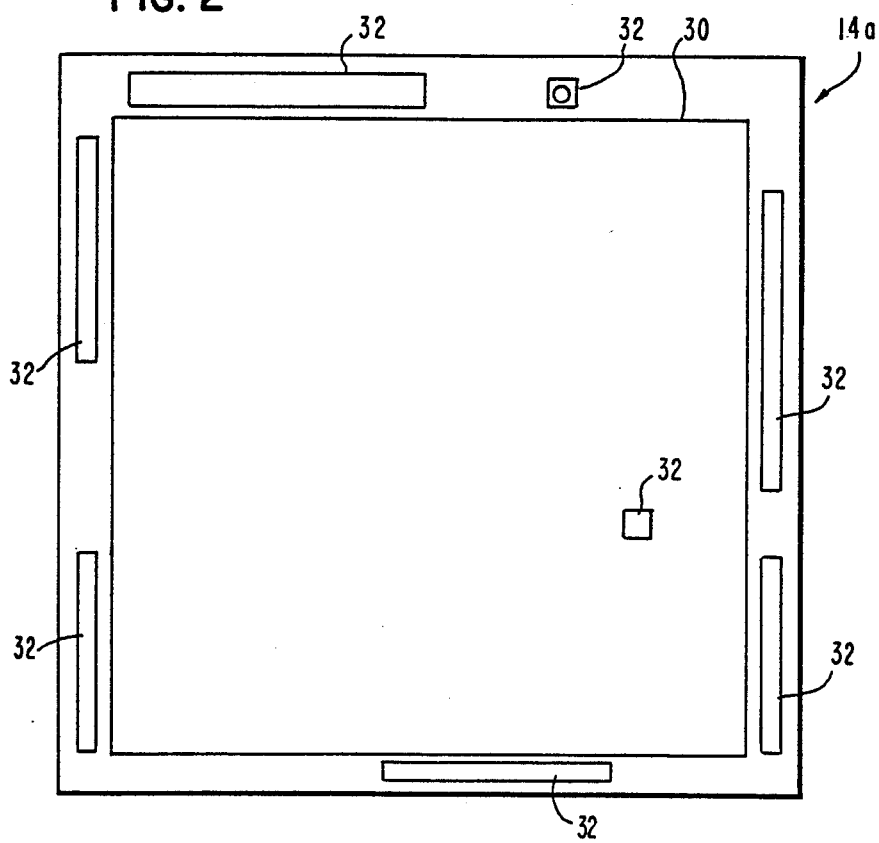
FIG. 2 is a top view of a thin film layer showing an active wiring region 30 and a plurality of process monitor sites 32 peripherally disposed about the active region.

In accordance with the invention the thin film region 14 of the carrier 10 is provided with at least one fabrication process monitor for monitoring the quality of the fabrication process during the formation of the region 14. The process monitor is formed integrally with a thin film layer, such as by the aforementioned photolithographic process. FIG. 2 illustrates the thin film layer 14a having a centrally disposed densely wired active wiring region 30 which is surrounded by peripherally disposed fabrication monitor sites 32. The placement and number of the sites 32 as shown in FIG. 2 is exemplary, it being realized that a particular layer may contain from one to some arbitrarily large number of sites. In accordance with one aspect of the invention the sites 32 are located such that they do not occupy or significantly interfere with the surface area required for the wiring region 30 while still being disposed near enough the wiring region such that the electrical and physical characteristics of the thin film is substantially the same. As will be described later, a monitor site or sites may also be provided within the active wiring region at regions of lesser wiring density. Further in accordance with the invention four different presently preferred types of thin film fabrication process monitors will now be described in detail.

Figures 3, 3A:
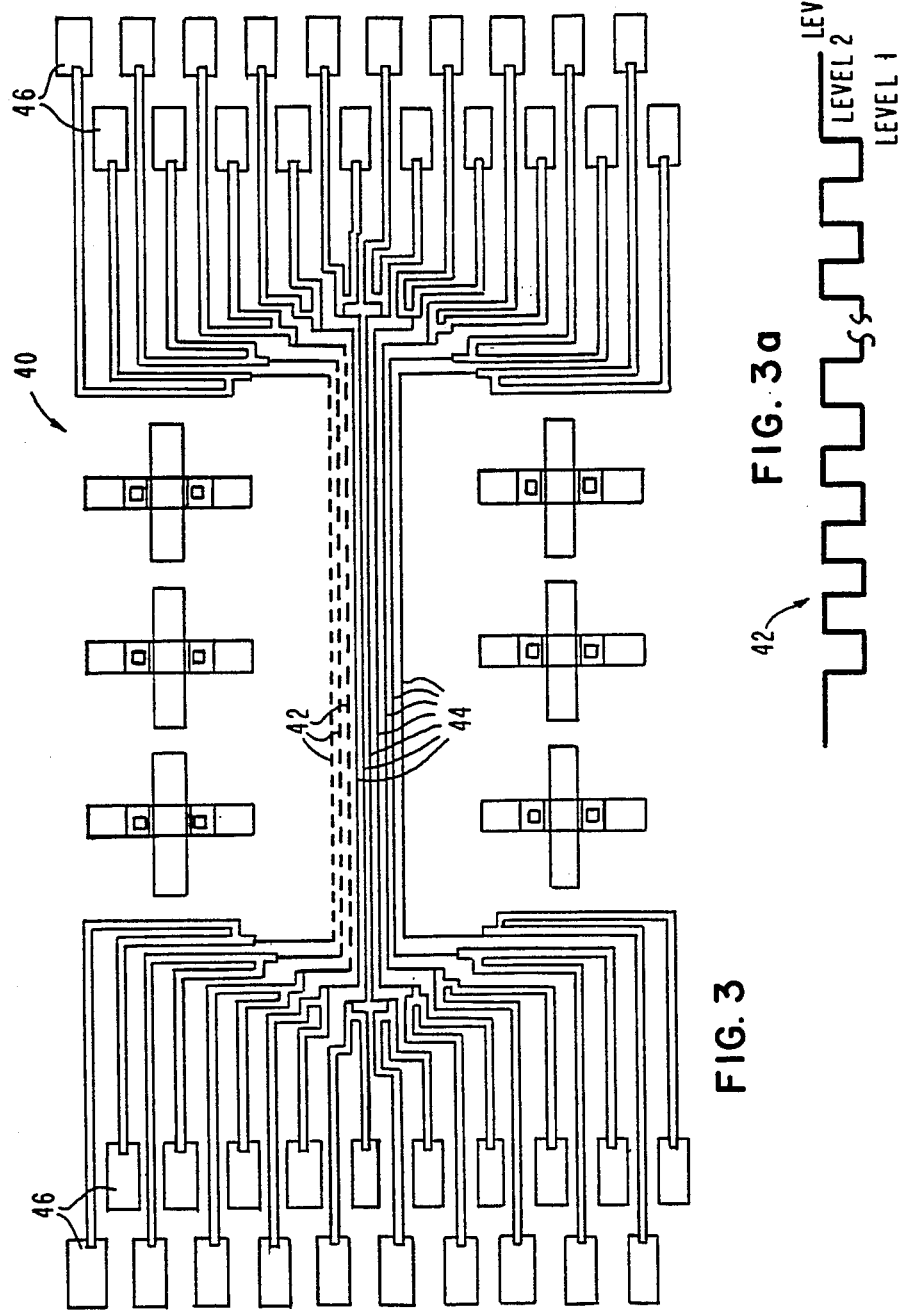
FIG. 3 shows a via/line process monitor 40 which includes three via chains 42 and seven lines 44 that are tested for four-point resistance measurements via four edge pads 46.
FIG. 3a is a side view of one of the via chains 42.

FIG. 3 shows an enlarged top composite view of a via/line process monitor 40. Monitor 40 includes three via chains 42 and seven lines 44 that are each tested for four-point resistance measurements through four associated edge pads 46. The specific embodiment shown in FIG. 3 is appropriate for testing a thin film region having seven metal layers. Each of the lines 44 is placed on a separate one of the thin film layers. A four-point measurement of resistance R and of the line width W by a top optical inspection procedure yields an indication of the metal resistivity $\rho$ since $R = \rho l / wt$, where l is the line length (for example 2775 micrometers) and t is the line thickness. The value of the thickness t may be determined by another one of the process monitors, specifically the dielectric monitor described below and shown in FIGS. 4a and 4b. The via-line process monitor 40 occupies one of the peripheral sites 32.

In FIG. 3 there are 74 discrete vias in each via chain 42, each of the via chains 42 connecting between a group of three layers as the layers are sequentially built-up. By example, the upper chain 42 is between layers 1-2-3, the second chain is between layers 3-4-5 and the third chain is between layers 5-6-7. FIG. 3a shows the upper one of the three via chains 42 in cross-section. Resistance measurement in this case verifies the via integrity which is especially important in that some of the vias must connect through the entire seven layers of the thin film stack for coupling to the substrate as shown in FIG. 1. Redundant chains may be added between levels 1-2-3-4-5-6-7 as well, or any other combination of layers of the full stack in order to accurately simulate the multi-level vias in the active wiring area 32.

FIG. 4a shows a top view and FIG. 4b a cross-sectional view of a dielectric measurement monitor site 50 which includes two circular metallic plates 52 and 54. The bottom plate 54 has two side protrusions 56 that are brought to test pads by side vias 58. This particular type of process monitor site requires for fabrication a contiguous group of three layers; one for the top plate 52, one for the bottom plate 54 and an intervening layer. Interspersed stacks can also be fabricated to accommodate layers such as 1-2-3, 2-3-4, 3-4-5, etc. By measuring the capacitance (C) of this thin film structure, where $C = \epsilon A / h$ (A = area of disc) the dielectric constant $\epsilon$ of the insulator or the height h of either the insulator or the metal layer can be readily determined. By example, in the case of a six micrometer thick layer a 600 micrometer diameter disc occupies a relatively small amount of layer surface area while substantially eliminating the effect of any fringe capacitance. The structure has a measurable C of approximately 1.46 pf which is, in accordance with the invention, used to monitor the layer thicknesses or the insulator dielectric constant. A larger disc approximately 1500 micrometer in diameter and having a correspondingly larger measurable capacitance can be fabricated at another of the monitor sites 32 to measure the final stack thickness and dielectric constant of the thin film plane-pair.

Figure 5A:
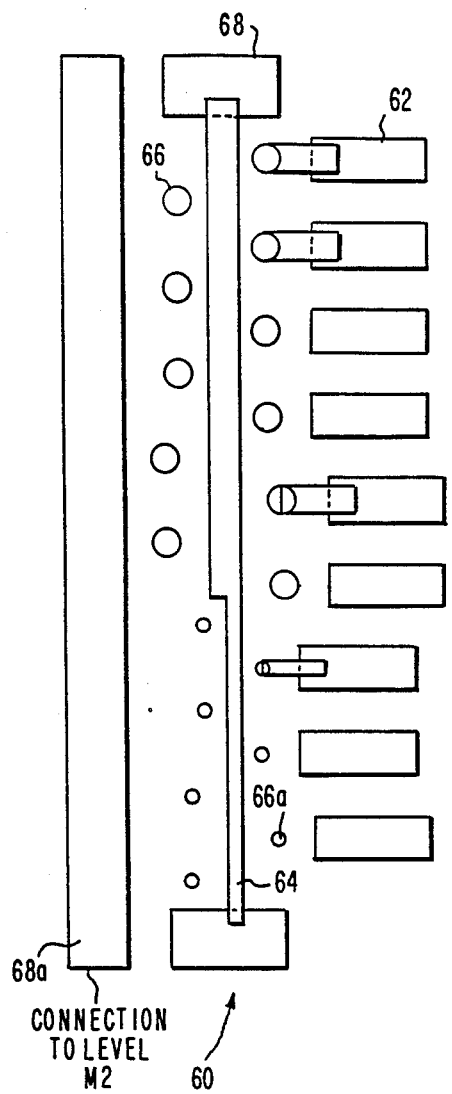
FIGS. 5a and 5b illustrate a laser-assisted process monitor 60 which is suitable for engineering change writing applications.
Figure 5B:
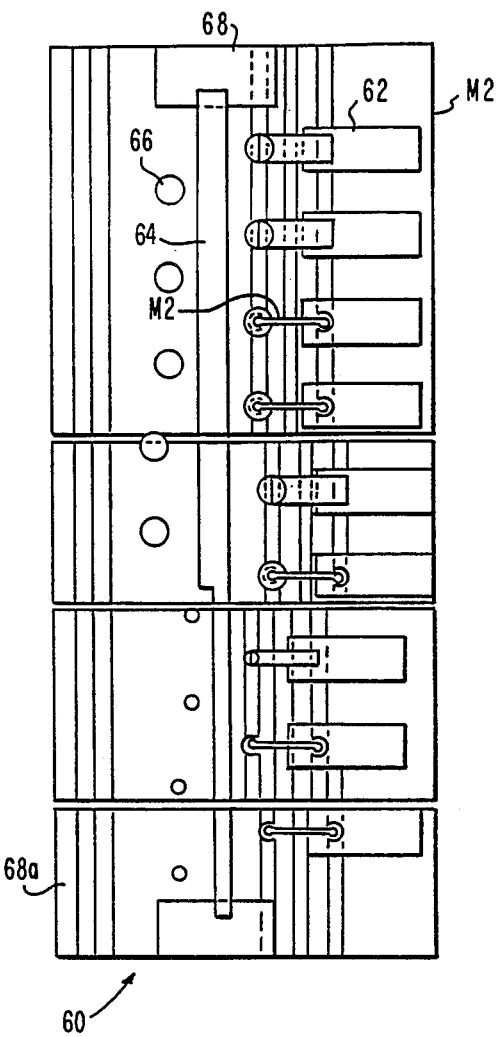
Figure 6:
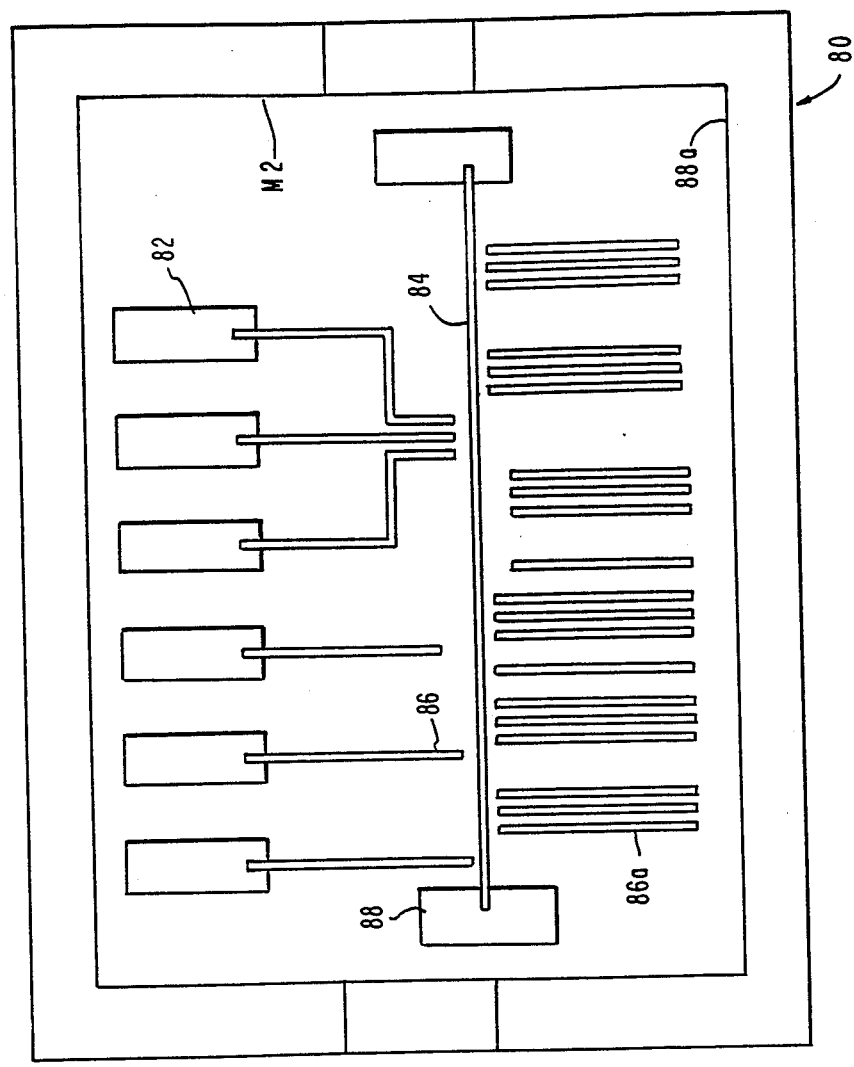
FIG. 6 illustrates another laser assisted process monitor especially adapted for laser repair applications.

Two other types of process monitors of the invention, specifically tooling related monitors, are shown in FIGS. 5 and 6. These two types of monitors are specifically relevant to laser assisted processes such as laser written engineering change activities and the repair of wiring layers. In general, a given laser deposition process is a complex function dependent on parameters such as the laser (power density, wavelength, beam spot size, focus etc.), substrate (optical and thermal properties), and organometallic source (vapor pressure, decomposition temperature, kinetics, etc.). It is not uncommon for the laser writing parameters, such as the laser power, to vary substantially from one sample to another or even on the same sample from day to day. In the case of the thin film wiring carrier, where the optical and thermal properties of the insulator and the metal conductors are very different, such process instabilities have the potential to cause severe physical damage to the carrier.

In accordance with this aspect of the invention these problems are eliminated by initially setting up the laser parameters on a given substrate on process monitors which occupy the periphery, or inactive area, of a thin film layer. Once the laser parameters are determined as a function of the physical characteristics of the particular thin film layer or layers to be tooled, laser writing can proceed in the active regions. The utility of such laser process monitors is readily enhanced by the addition of in-situ electrical probes (4-point or 2-point). In this manner the laser deposition parameters can be fine tuned to produce the highest quality electrical connections as measured at the monitor sites 32 before any laser writing is attempted in any active regions. The in-situ probes can be, for example, either standard needle probes or test cards which are custom designed for a given set of process monitors. Moreover the quality of the laser process can be monitored by visual inspection as well.

FIGS 5a and 5b illustrate two views of a laser-assisted process monitor, designated 60, which is suitable for engineering change writing applications while the monitor 80 of FIG. 6 is especially suited for laser repair applications. In both cases, laser writing is done between a center line (64, 84) and laterally disposed circular pads 66 or lines 86 having a range of dimensions and spacings. As an example, the circular pad 66 has a diameter of 50 micrometers and is spaced 25 micrometers from centerline 64 while the pad 66a has a diameter of 25 micrometers and is spaced 50 micrometers from the centerline. Disposed beneath these structures, which in the case of the repair monitor 80 of FIG. 6 can be placed on any of the wiring layers, there is formed a metal plate. Contact to this metal plate, shown as being on level M2, is made on the sides through strips (68a, 88a). Four-point probe resistance measurement of the laser written areas is performed through pads (62, 68) and (82, 88), respectively. Shorting through the dielectric layer is readily detected by measuring continuity between pads 68a and 62 or between 88a and 82. Optical inspection for any damage done by the high energy laser and of the structural characteristics of a deposited conductor are also readily accommodated. In addition, in the case of the laser EC monitor 60 some of the circular capture pads connect to test pads through wiring lines on an M1 level below and also through vias, as shown in FIG. 5b, thus reproducing the actual cross-sectional configurations employed in the active areas. Some of the circular pads, such as 66, and lines, such as 86a, are shown without test pads. These can be used for monitoring the integrity of the connection to the center line by visually inspecting the quality of deposition. In this case a pad or line can be employed alone by using the laser to write a test conductor which joins to or lies adjacent to one of pads or lines and thereafter visually inspecting the test conductor for, by example, the quality of the interconnection of the test conductor with the pad or line. A tooling monitor can thus be greatly simplified. The EC monitor shown in FIGS. 5a and 5b has an area of approximately 1.6×0.675 mm while the repair monitor of FIG. 6 has an area of approximately 1.12×1.46 mm although even smaller dimensions are readily achievable. The monitors are preferably designed to closely resemble the representative dimensions of conductors used in the active wiring area.

Given the relatively small surface area occupied by these process monitors of the invention one or more may be incorporated within the perimeter of the active area to provide valuable information concerning process uniformity. Process uniformity is known to the problematic as the substrate area increases. Such internally disposed process monitor sites are preferably incorporated in regions were the wiring density is lowest in order not to significantly affect the electrical characteristics of the X and Y transmission lines or the reference planes.

Based on the foregoing disclosure of preferred embodiments of the invention those having skill in the art may derive modifications to this teaching in regards to, for example, fabrication process monitors and/or tooling monitors other than laser tooling monitors, such as wire-bonders and decal ultrasonic bonders. Therefore the invention is not to be considered to be limited to only the specific embodiments and dimensions disclosed herein. Furthermore, it will be understood by those skilled in the art that other changes in form and details may be made without departing from the spirit and scope of the invention.

Having thus described our invention, what we claim as new, and desire to secure by Letters Patent is:

1. A device for conductively coupling together a plurality of integrated circuit chips, the device including at least one layer of thin film material having an active wiring area comprised of electrical conductors and an electrical insulator, the active wiring area conductively coupling together, in a required manner, electrical terminals of at least some of the plurality of integrated circuit chips, the at least one layer further comprising at least one thin film fabrication process monitor integrally formed therewith at a position or positions which do not reduce the area of or otherwise significantly interfere with the active wiring area.

2. A device as set forth in claim 1 wherein the at least one thin film fabrication process monitor is disposed at a periphery of the active wiring area.

3. A device as set forth in claim 1 wherein one of the at least one thin film fabrication process monitor monitors the quality of fabrication of the electrical conductors within the active wiring area and includes a length of electrical conductor having at least one test pad coupled to each end.

4. A device as set forth in claim 3 wherein the length of electrical conductor has a width which is substantially equal to a width of the electrical conductors within the active wiring region.

5. A device as set forth in claim 4 wherein the device includes a plurality of layers of thin film material and wherein the length of electrical conductor is disposed such that it repetitively traverses through a plurality of layers of the thin film material.

6. A device as set forth in claim 5 wherein the width is approximately ten to thirty micrometers.

7. A device for coupling together a plurality of integrated circuit chips, the device including at least one layer of thin film material having an active wiring area comprised of electrical conductors and an electrical insulator, the at least one layer further comprising at least one thin film fabrication process monitor integrally formed therewith at a position or positions which do not reduce the area of or otherwise significantly interfere with the active wiring area, and wherein one of the at least thin film fabrication process monitor monitors the quality of a dielectric constant associated with the electrical insulator and includes a first and a second electrically conductive plate means having at least one intervening layer comprised of the electrical insulator interposed therebetween.

8. A device as set forth in claim 7 wherein the first plate means is disposed beneath the second plate means, the first plate means having at least one electrically conductive via coupled to an edge thereof and extending upwardly through the at least one intervening layer of electrical insulator.

9. A device as set forth in claim 8 wherein each of the plate means has a substantially circular shape having a predetermined diameter.

10. A device as set forth in claim 9 wherein the predetermined diameter is approximately 600 micrometers.

11. A device including at least one layer of thin film material having an active wiring area comprised of electrical conductors and an electrical insulator, the at least one layer further comprising at least one thin film fabrication process monitor integrally formed therewith at a position or positions which do not reduce the area of or otherwise significantly interfere with the active wiring area, wherein one of the at least one thin film fabrication process monitor monitors the quality of a laser tool-assisted fabrication or repair of the electrical conductors within the active wiring area and includes at least two electrical conductors which are spaced apart from one another such that a laser tool conductively couples the two spaced apart conductors together by generating an electrically conductive region between the two conductors.

12. A device including at least one layer of thin film material having an active wiring area comprised of electrical conductors and an electrical insulator, the at least one layer further comprising at least one thin film fabrication process monitor integrally formed therewith at a position or positions which do not reduce the area of or otherwise significantly interfere with the active wiring area, wherein one of the at least one thin film fabrication process monitor monitors the quality of a laser tool-assisted fabrication or repair of the electrical conductors within the active wiring area and includes at least one electrical conductor disposed such that a test conductor formed by a laser tool is readily compared to the electrical conductor by visual inspection.

13. A multi-chip carrier comprising:
a substrate;
a region comprised of a plurality of thin film layers disposed one upon another to form a multilayered structure, at least one of the layers having an active wiring area comprised of a plurality of electrically conductive pathways insulated one from another by electrically insulating material, the region having a bottom surface which overlies a top surface of the substrate; and
a plurality of electrically conductive terminals, the terminals being disposed upon a top surface of the region, conductively coupled to certain of the pathways, and for connecting to electrical terminals of at least a plurality of integrated circuit chip means for interconnecting together, in a predetermined manner, the chip means, and wherein at least one of the thin film layers includes at least one thin film fabrication process monitor integrally formed therewith and determining a predetermined characteristic of the associated thin film layer either alone or in combination with a predetermined characteristic of one or more underlying thin film layers.

14. A carrier as set forth in claim 13 wherein the at least one thin film fabrication process monitor is disposed outside of and at a periphery of the active wiring area.

15. A carrier as set forth in claim 13 wherein the at least one thin film fabrication process monitor is disposed within the active wiring area.

16. A carrier as set forth in claim 13 wherein one of the at least one thin film fabrication process monitor monitors the quality of fabrication of the electrically conductive pathways within the active wiring area.

17. A multi-chip carrier comprising:
a substrate;
a region comprised of a plurality of thin film layers, at least one of the layers having an active wiring area comprised of a plurality of electrically conductive pathways insulated one from another by electrically insulating material, the region having a bottom surface which overlies a top surface of the substrate; and
a plurality of electrically conductive terminals, the terminals being disposed upon a top surface of the region, conductively coupled to certain of the pathways, and for connecting to electrical terminals of at least integrated circuit chip means for interconnecting together, in a predetermined manner, the chip means, and wherein
at least one of the thin film layers includes at least one thin film fabrication process monitor integrally formed therewith, and wherein one of the at least one thin film fabrication process monitor monitors the value of a dielectric constant associated with the electrically insulating material.

18. A multi-chip carrier comprising:
a substrate;
a region comprised of a plurality of thin film layers, at least one of the layers having an active wiring area comprised of a plurality of electrically conductive pathways insulated one from another by electrically insulating material, the region having a bottom surface which overlies the top surface of the substrate; and
a plurality of electrically conductive terminals, the terminals being disposed upon a top surface of the region, conductively coupled to certain of the pathways, and for connecting to electrical terminals of at least integrated circuit chip means for interconnecting together, in a predetermined manner, the chip means, and wherein at least one of the thin film layers includes at least one thin film fabrication process monitor integrally formed therewith, wherein one of the at least one thin film fabrication process monitor monitors the quality of a laser assisted fabrication or repair of the electrically conductive pathways.

19. A method of fabricating a device having at least two thin film layers, a second one of the layers overlying a first one of the layers, comprising the steps of:
forming the first thin film layer such that the layer includes an active wiring region including a plurality of electrically conductive pathways and an electrical insulator;
providing, during the step of forming, at least one thin film fabrication process monitor upon the layer at a position or positions which do not reduce an area of or otherwise significantly interfere with the active wiring region; and
detecting, by way of the at least one process monitor and before a subsequent step of forming the second thin film layer over the first thin film layer, at least one characteristic of the first thin film layer.

20. A method as set forth in claim 19 wherein the step of providing provides at least one electrically conductive test pathway for monitoring the quality of fabrication of the electrically conductive pathways and wherein the step of detecting includes a step of measuring a resistance of the test pathway.

21. A method of fabricating a device having at least one thin film layer comprising the steps of:
forming the at least one thin film layer such that the at least one layer includes an active wiring region including a plurality of electrically conductive pathways and an electrical insulator; providing, during the step of forming, at least one thin film fabrication process monitor upon the at least one layer at a position or positions which do not reduce an area of or otherwise significantly interfere with the active wiring region; and detecting, by way of the at least one process monitor, at least one characteristic of the at least one thin film layer, wherein the step of providing provides a structure which includes two spaced apart conductive plates having the electrical insulator disposed therebetween and wherein the step of detecting includes a step of measuring a capacitance associated with the structure, the measured capacitance being indicative of at least the dielectric constant associated with the electrical insulator.

22. A method of fabricating a device having at least one thin film layer comprising the steps of:

forming the at least one thin film layer such that the at least one layer includes an active wiring region including a plurality of electrically conductive pathways and an electrical insulator;

providing, during the step of forming, at least one thin film fabrication process monitor upon the at least one layer at a position or positions which do not reduce an area of or otherwise significantly interfere with the active wiring region; and detecting, by way of the at least one process monitor, at least one characteristic of the at least one thin film layer, and wherein the step of providing provides one of the at least one thin film fabrication process monitor for monitoring the quality of a laser assisted fabrication or repair of the electrically conductive pathways.

23. A method of calibrating a laser tool for operation on a thin film layer comprising the steps of:

providing the thin film layer including a plurality of electrically conductive pathways and an electrical insulator, the layer also being provided with a laser tool calibration region having at least one electrically conductive region;

operating the laser tool within the laser tool calibration region to form a test conductor therein, the test conductor being closely adjacent to or in contact with the at least one conductive region;

measuring a characteristic of the test conductor; and adjusting, if necessary, one or more operational parameters of the laser tool based upon the measured characteristic.

24. A method as set forth in claim 23 wherein the step of measuring includes a step of determining a value of electrical resistance of the test conductor.

25. A method as sat forth in claim 23 wherein the step of measuring includes a step of visually inspecting the test conductor.

* * * * *